United States Patent
Yanagisawa et al.

[11] Patent Number: 5,851,850
[45] Date of Patent: Dec. 22, 1998

[54] METHOD FOR FABRICATING A GAP TYPE SEMICONDUCTOR SUBSTRATE OF RED LIGHT EMITTING DEVICES

[75] Inventors: Munehisa Yanagisawa, Takasaki; Susumu Higuchi, Annaka; Yuuki Tamura, Annaka; Akio Nakamura, Annaka; Toshio Otaki, Takasaki, all of Japan

[73] Assignee: Shin-Etsu Handotai Co., Ltd., Tokyo, Japan

[21] Appl. No.: 516,096

[22] Filed: Aug. 17, 1995

Related U.S. Application Data

[63] Continuation-in-part of Ser. No. 377,132, Jan. 23, 1995, Pat. No. 5,514,881, which is a continuation-in-part of Ser. No. 38,693, Mar. 29, 1993, abandoned.

[30] Foreign Application Priority Data

Jul. 31, 1992 [JP] Japan ................................. 4-225324

[51] Int. Cl.$^6$ ................................................. H01L 21/00
[52] U.S. Cl. ................................ 438/46; 438/22; 438/45; 438/557
[58] Field of Search .................... 438/46, 47, 34, 438/37, 22, 925, 45, 557

[56] References Cited

U.S. PATENT DOCUMENTS

| | | | |
|---|---|---|---|
| 3,951,699 | 4/1976 | Naito et al. .............................. | 438/46 |
| 4,017,880 | 4/1977 | Kasami et al. ............................ | 438/37 |
| 4,303,464 | 12/1981 | Suzuki et al. ............................ | 117/17 |
| 4,585,511 | 4/1986 | Bult et al. ............................... | 438/502 |
| 4,734,267 | 3/1988 | Kojima ................................... | 117/208 |

FOREIGN PATENT DOCUMENTS 0 102 734  3/1984  European Pat. Off. .

OTHER PUBLICATIONS

Nishio et al, "Influence of Melt Preparation on Residual Impurity Concentration in Semi–Insulating LEC GaAs", Journal of Crystal Growth 96 (1989), pp. 605–608, 1989.

Young et al, "The Electrical Properties of Undoped and Oxygen doped GaP grown by the Liquid Encapsulation Technique", J. Phys. D., Appli. Phys, 1971, vol. 4, pp. 995–1005, 1971.

Primary Examiner—Michael Trinh
Attorney, Agent, or Firm—Townsend & Banta

[57] ABSTRACT

A semiconductor substrate for GaP type light emitting devices which includes an n-type single crystal substrate, an n-type GaP layer, and a p-type GaP layer formed on the n-type GaP single crystal substrate. The carbon concentration in the n-type GaP single crystal substrate is more than $1.0 \times 10^{16}$ atoms/cc but less than $1.0 \times 10^{17}$ atoms/cc. The n-type GaP single crystal substrate is obtained from an n-type GaP single crystal grown by the Liquid Encapsulation Czochralski method wherein $B_2O_3$ containing water corresponding to 200 ppm or more is used as an encapsulation liquid.

5 Claims, 3 Drawing Sheets

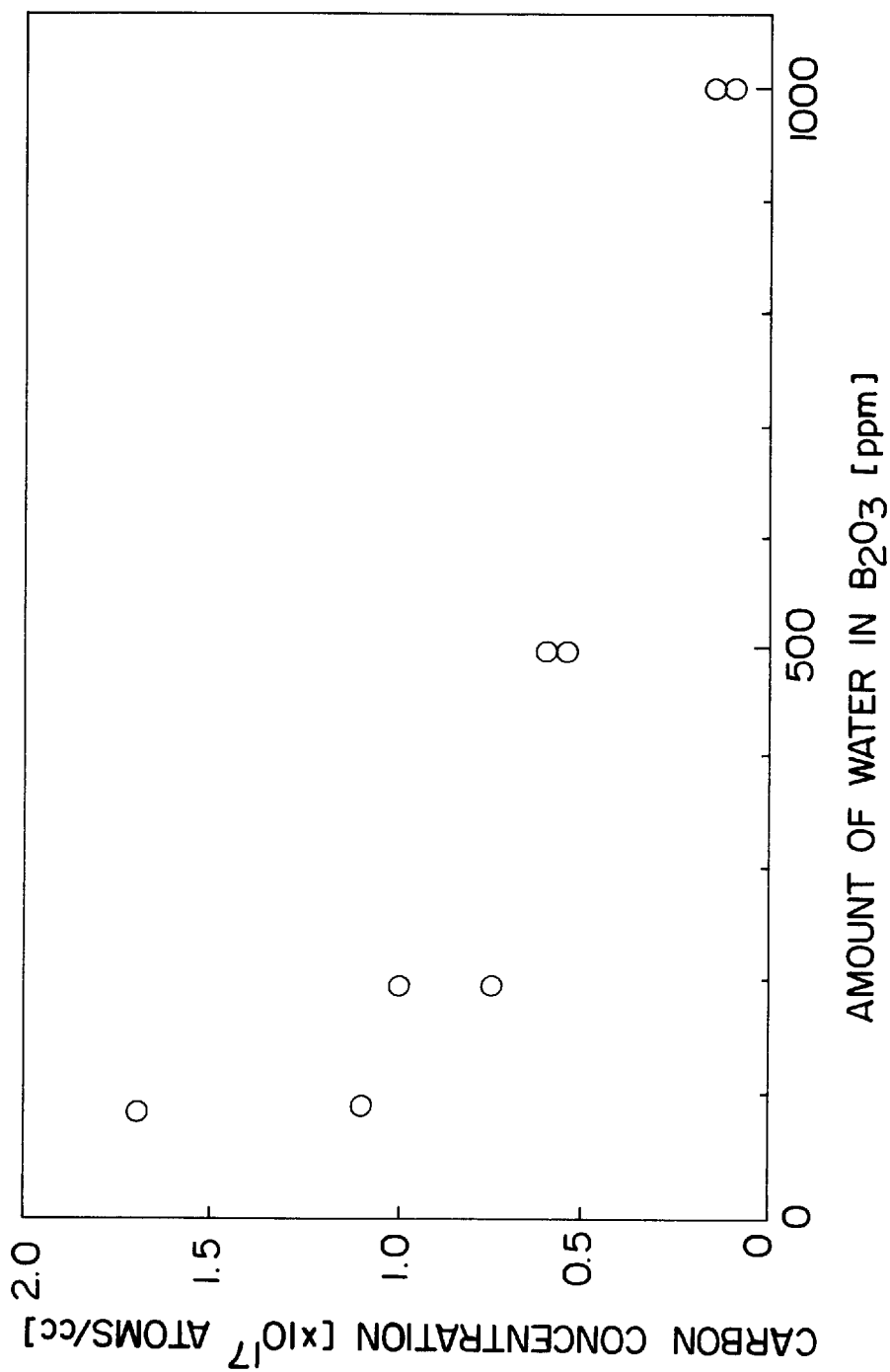

5,851,850

METHOD FOR FABRICATING A GAP TYPE SEMICONDUCTOR SUBSTRATE OF RED LIGHT EMITTING DEVICES

CROSS REFERENCE TO RELATED APPLICATION

This application is a Continuation-In-Part patent application of U.S. Continuation-In-Part patent application Ser. No. 08/377,132 filed Jan. 23, 1995, U.S. Pat. No. 5,514,881 of the parent application, U.S. patent application Ser. No. 08/038,693 filed Mar. 29, 1993, now abandoned.

FIELD OF THE INVENTION

This invention relates to a semiconductor substrate for GaP type light emitting devices and a method for fabricating the same and, in particular, to a semiconductor substrate for GaP type light emitting devices in which a plurality of GaP layers are formed to provide GaP type light emitting devices which emit red light, and a method for fabricating the same.

BACKGROUND OF THE INVENTION

Light emitting devices are generally fabricated by the steps of forming a plurality of semiconductor layers on a semiconductor substrate to fabricate a multi-layer semiconductor substrate having a pn junction, and fabricating the substrates to devices. Among these light emitting devices, GaP type light emitting diodes, which emit red light, are fabricated from a semiconductor substrate for the light emitting devices consisting of a n-type GaP single crystal substrate on which n-type and p-type GaP layers are formed.

The compound semiconductor GaP does not emit red light by itself even if a pn junction is formed in a substrate consisting thereof so that zinc (ZN) and oxygen (O) are doped into a p-type layer, and pairs of Zn—O, which become light emitting centers, are formed in the p-type layer. GaP type light emitting diodes fabricated from the semiconductor substrate for GaP type light emitting devices emit red light having a peak wavelength of about 700 nm.

However, according to the conventional light emitting devices fabricated from the semiconductor substrate for GaP type light emitting devices processed by the above convention method, there is a disadvantage in that substantially high luminance cannot be obtained.

SUMMARY OF THE INVENTION

It is an object of the present invention to provide a semiconductor substrate for GaP type light emitting devices from which light emitting devices with higher luminance than the conventional light emitting devices are fabricated, and a method for fabricating the same.

According to the present invention, a semiconductor substrate for GaP type light emitting devices includes an n-type GaP single crystal substrate, an n-type GaP layer, and a p-type GaP layer formed on the n-type GaP single crystal substrate, wherein the concentration of carbon contained in the n-type GaP single crystal substrate is more than $1.0 \times 10^{16}$ atoms/cc, but less than $1.0 \times 10^{17}$ atoms/cc.

If the n-type GaP single crystal is grown by the Liquid Encapsulation Czochralski (LEC) method, an n-type GaP single crystal containing carbon of the concentration as stated above is obtained by growing the single crystal using boron oxide ($B_2O_3$) as liquid for encapsulation containing at least 200 ppm of water, and then an n-type GaP single crystal substrate containing carbon of the concentration as stated above.

BRIEF DESCRIPTION OF THE DRAWINGS

The present invention is hereinafter explained in more detail in conjunction with the appended drawings.

FIG. 4 is a graph showing the relation between the amount of water in $B_2O_3$ used for growing the n-type GaP single crystal by the LEC method and the carbon concentration in the n-type GaP single crystal substrate obtained from the n-type GaP single crystal.

DESCRIPTION OF THE PREFERRED EMBODIMENT

An embodiment of the present invention will be explained by referring to the attached drawings.

Figure 1:
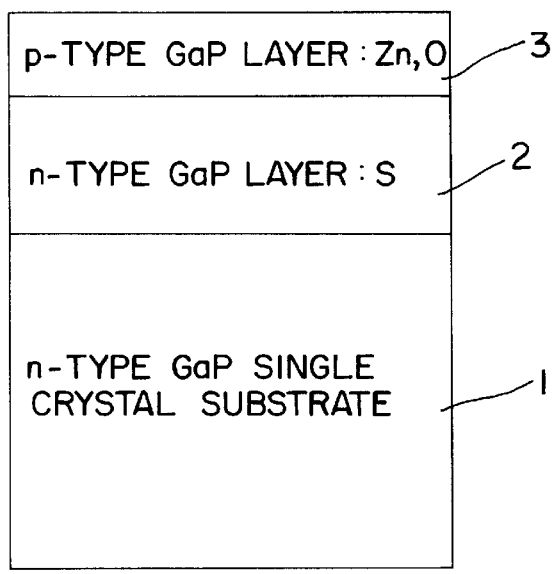
FIG. 1 is a schematic cross-sectional view illustrating the cross-sectional structure of the semiconductor substrate for light emitting devices in an embodiment according to the present invention.

FIG. 1 shows a semiconductor substrate for GaP type light emitting devices in the embodiment. In the semiconductor substrate for GaP type light emitting devices in this embodiment, a n-type GaP layer 2 and a p-type GaP layer 3 are successively formed on an n-type GaP single crystal substrate 1. For example, sulfur (S) and zinc (Zn) are used as dopants as n-type and p-type sources. The p-type GaP layer 3 is doped with oxygen (O), as well as zinc (Zn).

Figure 2:
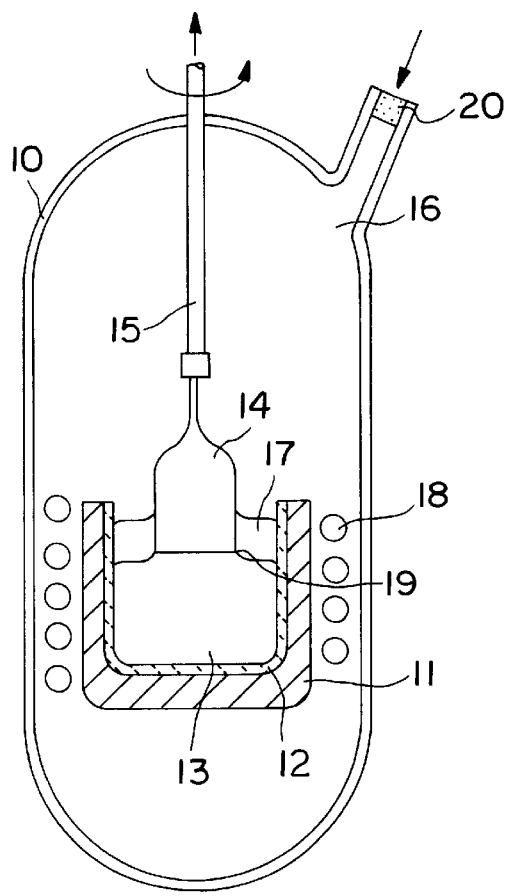
FIG. 2 is a structural view of an apparatus used for growing an n-type GaP single crystal in the embodiment according to the present invention.

An example of a method for fabricating the semiconductor substrate for GaP type light emitting devices mentioned above is hereinafter described. First, the n-type GaP single crystal substrate 1 is fabricated from the n-type GaP single crystal grown by the LEC method. More particularly, the growth step of the GaP single crystal by the LEC method is carried out using an apparatus as shown in FIG. 2. In FIG. 2, a crucible 12 supported by a susceptor 11 is provided in a pressure vessel 10, and a GaP melt 13 is included in the crucible 12.

The GaP melt 13 is covered on the top surface with $B_2O_3$ 17 which is lighter than the GaP melt 13 and is transparent. In order to avoid dissociation of GaP, the inside of the pressure vessel 10 is pressurized with an inert gas, such as nitrogen 16. A GaP single crystal 14 is grown by being pulled out of the GaP melt 13 by a rotating rod 15. Further, the GaP melt 13 is heated by a heater 18 so that an interface 19 between the fused GaP 13 and the GaP single crystal 14 is kept at 1470° C., which corresponds to the melting point of the GaP. For example, the inside of the pressure vessel 10 is monitored through a window 20 by a television monitor.

The GaP single crystal 14 grown by the process explained above is sliced to obtain GaP single crystal substrates 1, and the epitaxial layers are formed on the substrate 1 by the liquid phase epitaxy (LPE). More particularly, a solution which is prepared by dissolving polycrystal GaP into a Ga melt is positioned on the substrate at 1000° C. Next, the solution is cooled to make GaP in the solution precipitate and grow a GaP layer on the substrate. In the process, n-type dopants, such as sulfur, are added to the solution for growing the n-type GaP layer 2, and p-type dopants, such as zinc or oxide, are added thereto for growing the p-type GaP layer 3.

Thus, a semiconductor substrate for light emitting devices, which is a multi-layer GaP substrate, is obtained in which the n-type GaP layer and the p-type GaP layer are successively formed on the n-type GaP single crystal substrate. Then, n-electrodes are formed on the GaP single crystal substrate side of the semiconductor substrate for light emitting devices, and p-electrodes are formed on the p-type GaP layer side thereof, respectively. Then, after being cut to form chips, each chip is mounted on a frame and wire-bonded, and encapsulated in epoxy resin. Thus, light emitting diodes which emit red light are obtained.

Figure 3:
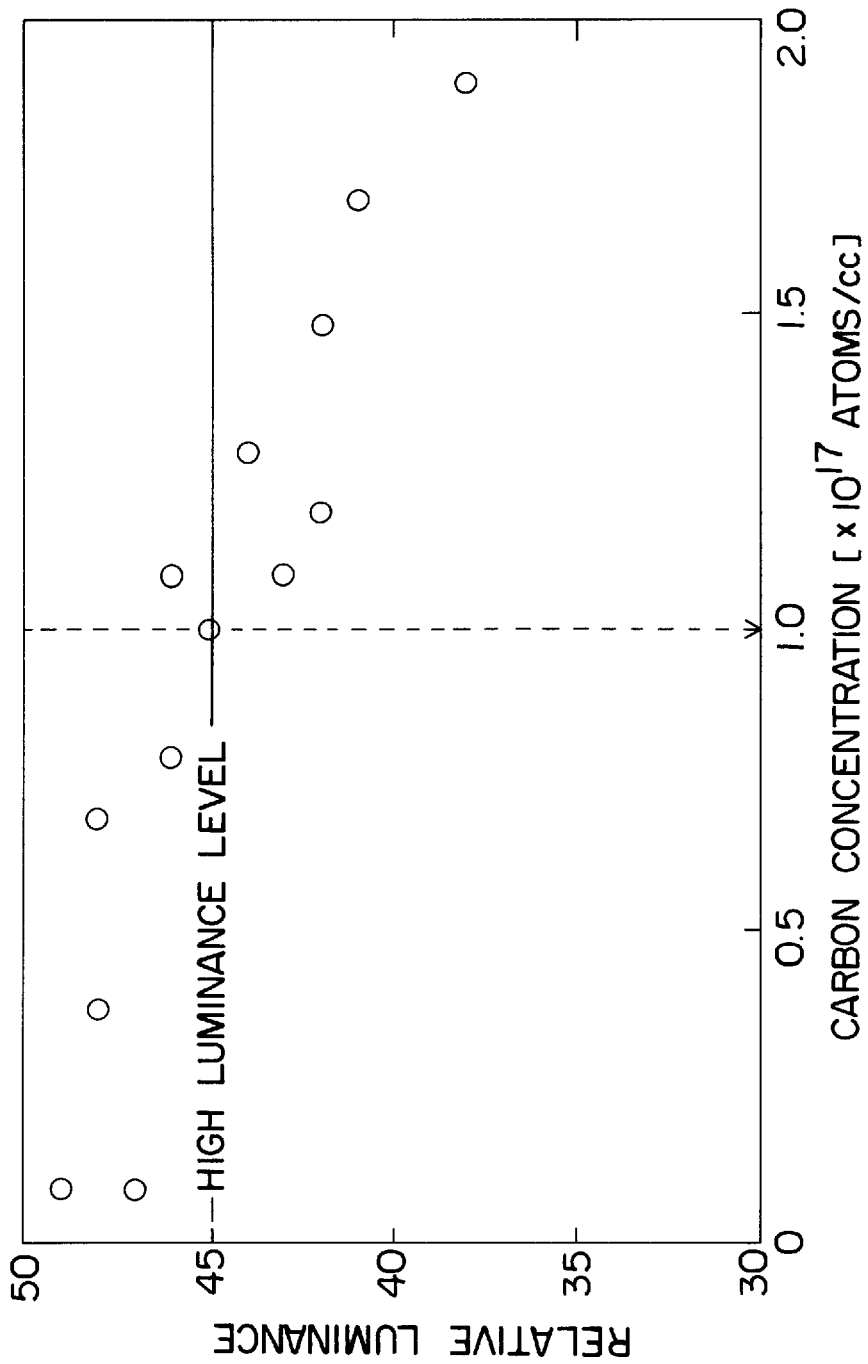
FIG. 3 is a graph showing the relation between the carbon concentration in the n-type GaP single crystal substrate and the luminance of the light emitting device fabricated therefrom.

FIG. 3 shows the relation between the carbon concentration in the n-type GaP single crystal substrate and relative luminance of the light emitting devices which emit red light fabricated from the semiconductor substrate for light emitting devices. As understood by FIG. 3, the luminance becomes higher as the carbon concentration decreases, and the carbon concentration in the n-type GaP single crystal substrate is required to be more than $1.0 \times 10^{16}$ atom/cc, but less than $1.0 \times 10^{17}$ atoms/cc to obtain light emitting devices having relative luminance higher than 45.

In order to obtain the n-type GaP single crystal substrate with a carbon concentration more than $1.0 \times 10^{16}$ atoms/cc, but less than $1.0 \times 10^{17}$ atoms/cc, the n-type GaP single crystal grown from GaP polycrystal wherein the original low carbon concentration is preferably used as a starting material. In this method, it is confirmed that the carbon concentration in the GaP single crystal substrate is more than $1.0 \times 10^{16}$, but less than $1.0 \times 10^{17}$ atoms/cc when the GaP polycrystal with the carbon concentration lower than $1.0 \times 10^{18}$ atoms/cc is used as the starting material.

On the other hand, when the n-type GaP single crystal is grown by the LEC method, it is possible to control the carbon concentration by controlling the amount of water contained in $B_2O_3$ used in the growth process as the encapsulation liquid.

FIG. 4 shows the relation between the amount of water contained in $B_2O_3$ used in the growth process and the carbon concentration in the GaP single crystal. As understood by FIG. 4, the carbon concentration in the n-type GaP single crystal becomes low as the amount of water in $B_2O_3$ increases. In particular, the carbon concentration decreases drastically and becomes equal to or lower than $1.0 \times 10^{17}$ atoms/cc when the amount of water in $B_2O_3$ becomes more than 200 ppm. Therefore, the carbon concentration in the n-type GaP single crystal can be kept low by controlling the amount of water in $B_2O_3$ which contributes improvement of luminance of the light emitting devices. Although the amount of water in $B_2O_3$ is not limited inasmuch as the amount of is not less than 200 ppm, there may be disadvantages in the scope of growing GaP single crystals if the amount of water in $B_2O_3$ is more than 1000 ppm. For example, chemical reactions may occur and the $B_2O_3$ layer may become opaque or crystal growth may be adversely affected.

As described above, according to the present invention, a GaP single crystal substrate in which the carbon concentration is more than $1.0 \times 10^{16}$ atoms/cc, but less than $1.0 \times 10^{17}$ atoms/cc can be obtained, and it is possible to fabricate light emitting devices of high luminance by a semiconductor substrate for light emitting devices including the GaP single crystal substrate.

Although the present invention has been described with respect to specific embodiments for complete and clear disclosure, the appended claims are not to be limited, but are to be construed as embodying all modifications and alternative constructions that may occur to one skilled in the art which fairly fall within the basic teachings herein set forth.

What is claimed is:

1. A method for fabricating a GaP type semiconductor substrate of red light emitting devices comprising the steps of:

growing an n-type single crystal containing more than $1.0 \times 10^{16}$ but less than $1.0 \times 10^{17}$ atoms/cc carbon by the Liquid Encapsulation Czochralski method using $B_2O_3$ as an encapsulation liquid, wherein said $B_2O_3$ contains at least 200 ppm water; and;

forming an n-type GaP layer and a p-type GaP layer successively on a semiconductor substrate obtained from said n-type GaP single crystal.

2. A method for fabricating a GaP type semiconductor substrate of red light emitting devices according to claim 1, comprising doping with sulfur said n-type GaP layer.

3. A method for fabricating a GaP type semiconductor substrate of red light emitting devices according to claim 1, further comprising doping with oxygen and zinc said p-type GaP layer.

4. A method for fabricating a GaP type semiconductor substrate of red light emitting devices according to claim 1, further comprising forming the n-type GaP layer and p-type GaP layer by liquid phase epitaxy.

5. A method for fabricating a GaP type semiconductor substrate of red light emitting devices according to claim 1, wherein a top surface of a GaP melt used in growing the n-type GaP single crystal by the Liquid Encapsulation Czochralski method is maintained at 1470° C. whie a GaP single crystal is grown with a rotating rod pulling the GaP layer single crystal out of a GaP melt.

* * * * *